(12) United States Patent
Yu et al.

(10) Patent No.: US 11,756,852 B2
(45) Date of Patent: Sep. 12, 2023

(54) SEMICONDUCTOR DEVICE

(71) Applicant: Taiwan Semiconductor Manufacturing Company, Ltd., Hsinchu (TW)

(72) Inventors: Chen-Hua Yu, Hsinchu (TW); Chun-Hui Yu, Hsinchu County (TW); Jeng-Nan Hung, Taichung (TW); Kuo-Chung Yee, Taoyuan (TW); Po-Fan Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/720,313

(22) Filed: Apr. 14, 2022

(65) Prior Publication Data
US 2022/0238408 A1 Jul. 28, 2022

Related U.S. Application Data

(63) Continuation of application No. 16/942,750, filed on Jul. 29, 2020, now Pat. No. 11,328,975.

(60) Provisional application No. 62/940,256, filed on Nov. 26, 2019.

(51) Int. Cl.
*H01L 23/36* (2006.01)
*H05K 7/20* (2006.01)
*H01L 23/04* (2006.01)

(52) U.S. Cl.
CPC .............. *H01L 23/36* (2013.01); *H01L 23/04* (2013.01); *H05K 7/20218* (2013.01)

(58) Field of Classification Search
CPC ...... H01L 23/36; H01L 23/04; H05K 7/20218
See application file for complete search history.

(56) References Cited

U.S. PATENT DOCUMENTS

| 7,713,789 B2 * | 5/2010 | Brunschwiler ..... H01L 21/4871 257/713 |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Peniel M Gumedzoe
(74) *Attorney, Agent, or Firm* — JCIPRNET

(57) ABSTRACT

A semiconductor device including a substrate, a semiconductor package, a plurality of pillars and a lid is provided. The semiconductor package is disposed on the substrate and includes at least one semiconductor die. The plurality of pillars are disposed on the semiconductor package. The lid is disposed on the substrate and covers the semiconductor package and the plurality of pillars. The lid includes an inflow channel and an outflow channel to allow a coolant to flow into and out of a space between the substrate, the semiconductor package, the plurality of pillars and the lid. An inner surface of the lid, which faces and overlaps the plurality of pillars along a stacking direction of the semiconductor package and the lid, is a flat surface.

20 Claims, 11 Drawing Sheets

(56) References Cited

U.S. PATENT DOCUMENTS

| | | | |
|---|---|---|---|
| 9,559,036 B1* | 1/2017 | Hsieh | H01L 21/565 |
| 2014/0307388 A1* | 10/2014 | Chiu | H05K 7/20254 |
| | | | 165/104.33 |
| 2019/0181116 A1* | 6/2019 | Lin | H01L 21/568 |

* cited by examiner

SEMICONDUCTOR DEVICE

CROSS-REFERENCE TO RELATED APPLICATION

This application is a continuation application of and claims the priority benefit of U.S. application Ser. No. 16/942,750, filed on Jul. 29, 2020, now allowed, which claims the priority benefit of U.S. Provisional Application No. 62/940,256, filed on Nov. 26, 2019. The entirety of each of the above-mentioned patent applications is hereby incorporated by reference herein and made a part of this specification.

BACKGROUND

A typical problem with miniaturization of semiconductor devices is heat dissipation during operation. A prolonged exposure of a die by operating at excessive temperatures may decrease the reliability and lifetime of the die. This problem may become severe if the die generates a lot of heat during operation. As such, improvements to heat transfer are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Figure 1:
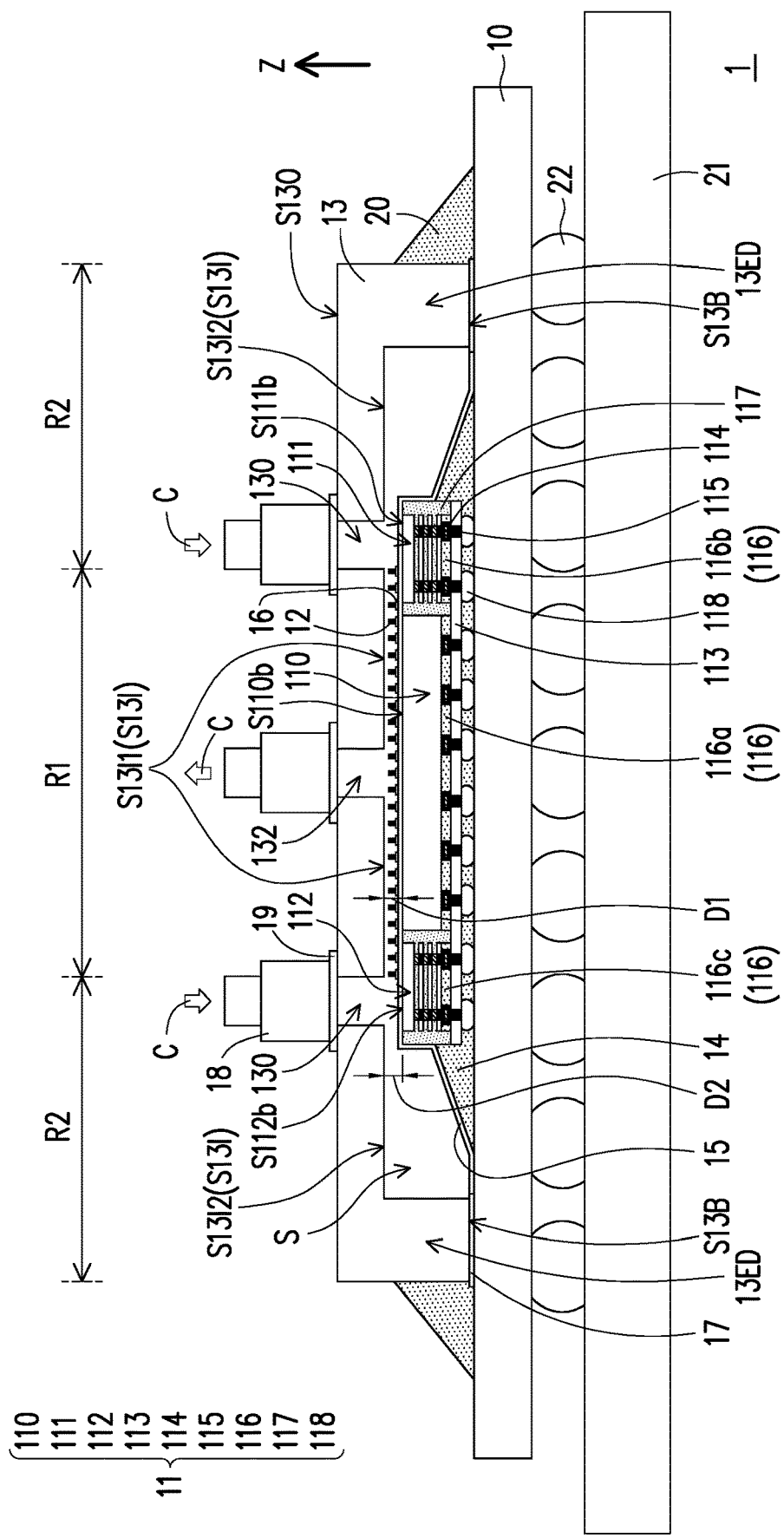
FIG. 1 through FIG. 5 are cross-sectional views schematically illustrating semiconductor devices according to some embodiments of the present disclosure.

Corresponding numerals and symbols in the different figures generally refer to corresponding parts unless otherwise indicated. The figures are drawn to clearly illustrate the relevant aspects of the embodiments and are not necessarily drawn to scale. Furthermore, dashed outlines depict regions where a layer or a component of the package is beneath or behind another layer or component.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 through FIG. 5 are cross-sectional views schematically illustrating semiconductor devices according to some embodiments of the present disclosure.

Referring to FIG. 1, a semiconductor device 1 including a substrate 10, a semiconductor package 11, a plurality of pillars 12 and a lid 13 is provided.

The substrate 10 may include elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the substrate 10 includes silicon on insulator (SOI) or silicon-germanium on insulator (SGOI). In some embodiments, the substrate 10 includes active components (e.g., transistors or the like) formed therein. In some embodiments, the substrate 10 includes passive components (e.g., resistors, capacitors, inductors, or the like) formed therein. In some embodiments, the substrate 10 includes a silicon wafer. In some embodiments, the substrate 10 is a package substrate or ball grid array (BGA) substrate including one or more active components, passive components, or a combination thereof. In some embodiments, the substrate 10 also includes interconnection structures and/or redistribution layers (not shown) to connect various components therein to form functional circuitry. In some embodiments, the substrate 10 may be provided for dual-side electrical connection.

The semiconductor package 11 is disposed on the substrate 10 and includes at least one semiconductor die (e.g., semiconductor dies 110, 111 and 112). In some embodiments, the semiconductor package 11 may further include an interposer 113, connectors 114, through vias 115, an underfill 116, an encapsulant 117 and connectors 118 in addition to the semiconductor dies 110, 111 and 112.

Each of the semiconductor dies 110, 111 and 112 may include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 110, 111 and 112 include a memory die such as a high bandwidth memory die. In some embodiments, the semiconductor dies 110, 111 and 112 may be the same type of dies or perform the same functions. In some embodiments, the semiconductor dies 110, 111 and 112 may be different types of dies or perform different functions. In some embodiments, the semiconductor die 110 includes a logic die, and the semiconductor dies 111 and 112 include memory dies. In some embodiments, the semiconductor dies 111 and 112 are memory stacks, including multiple chips (not marked) stacked on top of each other and electrically connected by connectors (not marked).

When the memory die include multiple chips, an insulating layer may be disposed between adjacent chips to protect the chips and the connectors. In some embodiments, a material of the insulating layer may include an encapsulant, a molding underfill, an epoxy, or a resin.

The semiconductor dies 110, 111 and 112 are bonded via the connectors 114 to through vias 115 formed within the interposer 113. A material of the connectors 114 may include copper, copper alloys, or other conductive materials, and the connectors 114 may be formed by deposition, plating, or other suitable techniques. In some embodiments, the connectors 114 are prefabricated structures attached to contact pads (not shown) of the semiconductor dies 110, 111 and 112. In some embodiments, the connectors 114 are solder balls, metal pillars, controlled collapse chip connection bumps, micro bumps, bumps formed via electroless nickel-electroless palladium-immersion gold technique (ENEPIG), combination thereof (e. g, a metal pillar with a solder ball attached), or the like. The interposer 113 may be made of a semiconductor material similar to those previously discussed with reference to the substrate 10, and will not be repeated here. A material of the through vias 115 may include one or more metals such as copper, titanium, tungsten, aluminum, the alloys, the combinations or the like.

The underfill 116 may be disposed between the semiconductor dies 110, 111 and 112 and the interposer 113 to protect the connectors 114 against thermal or physical stresses and secure the electrical connection of the semiconductor dies 110, 111 and 112 with the through vias 115. In some embodiments, the underfill 116 is formed by capillary underfill filling (CUF). A dispenser (not shown) may apply a filling material (not shown) along the perimeter of the semiconductor dies 110, 111 and 112. In some embodiments, a heating process is performed to let the filling material penetrate in the interstices defined by the connectors 114 between the semiconductor dies 110, 111 and 112 and the interposer 113 by capillarity. In some embodiments, a curing process is performed to consolidate the underfill 116. In some embodiments, the underfill 116 includes underfill portions 116a, 116b and 116c spaced apart from each other, wherein the underfill portion 116a is formed between the semiconductor die 110 and the interposer 113, the underfill portion 116b is formed between the semiconductor die 112 and the interposer 113, and the underfill portion 116c is formed between the semiconductor die 113 and the interposer 113. In some alternative embodiments, a single underfill (not shown) may extend below the semiconductor dies 110, 111 and 112 depending on the spacing and relative positions of the semiconductor dies 110, 111 and 112.

The encapsulant 117 may be formed on the interposer 113. The encapsulant 117 may cover the underfill 116 and surround the semiconductor dies 110, 111 and 112. In some embodiments, the encapsulant 117 is formed by completely covering the semiconductor dies 110, 111 and 112 with an encapsulation material (not shown), and then performing a planarization process (e.g., a mechanical grinding process and/or a chemical mechanical polishing step) until the backside surfaces S110b, S111b and S112b of the semiconductor dies 110, 111 and 112 are exposed. In some embodiments, the encapsulation material may be a molding compound, a molding underfill, a resin (such as an epoxy resin), or the like. In some embodiments, the encapsulation material is formed by an over-molding process. In some embodiments, the encapsulation material is formed by at least one of a compression molding process, an immersion molding process and a transfer molding process. In some embodiments, the encapsulation material may require a curing process.

The through vias 115 may be bonded to the substrate 10 via the connectors 118. A method of forming the connectors 118 and a material of the connectors 118 may be similar to those previously discussed with reference to the connectors 114, and will not be repeated here.

In some embodiments, the semiconductor device 1 further includes an underfill 14 disposed between the semiconductor package 11 and the substrate 10 to protect the connectors 118 against thermal or physical stresses and secure the electrical connection of the semiconductor package 11 with the substrate 10. A method of forming the underfill 14 and a material of the underfill 14 may be similar to those previously discussed with reference to the underfill 116, and will not be repeated here.

The plurality of pillars 12 are disposed on the semiconductor package 11. In some embodiments, the semiconductor device 1 further includes a seed layer 15 disposed between the plurality of pillars 12 and the semiconductor package 11. Specifically, the seed layer 15 may be formed at least on the top surface (including the backside surfaces S110b, S111b and S112b of the semiconductor dies 110, 111 and 112) of the semiconductor package 11 prior to the plurality of pillars 12. In some embodiments, the seed layer 15 is further formed on side surfaces of the semiconductor package 11 and on the underfill 14. In some embodiments, after the semiconductor package 11 and the underfill 14 are formed on the substrate 10, a shielding element (not shown; e.g., a jig or a protection tape) is disposed on the substrate 10. The shielding element has an opening that exposes the region (e.g., a region in which the semiconductor package 11 and the underfill 14 are located) where the seed layer 15 is to be formed. The seed material (not shown) is then formed on the shielding element and the elements (e.g., the semiconductor package 11 and the underfill 14) exposed by the opening of the shielding element through a sputtering process, a physical vapor deposition (PVD) process, a plating process, or the like. In some embodiments, the seed material includes copper, tantalum, titanium-copper alloys, or other suitable metallic materials. In some embodiments, the seed material includes polymers, hybrid materials or other suitable materials. The shielding element and the seed material formed thereon is then removed to form the seed layer 15 as shown in FIG. 1.

The plurality of pillars 12 are disposed on the seed layer 15 and overlapped with the semiconductor dies 110, 111 and 112 along a stacking direction Z of the semiconductor package 11 and the lid 13. The plurality of pillars 12 are adapted to dissipate heat generated by the heat sources (e.g., the semiconductor dies 110, 111 and 112) during usage through heat conduction, and the plurality of pillars 12 may be disposed closer to the heat sources to dissipate heat more efficiently. In some embodiments, a material of the plurality of pillars 12 includes copper, nanotube or other high thermal conductivity materials. In some embodiments, the high thermal conductivity materials include metal diamond composites, such as Cu diamond, silver diamond, Al diamond, or the like. In some embodiments, the plurality of pillars 12 are formed through a placement process. In some embodiments, the plurality of pillars 12 are formed through a plating process, and the semiconductor device 1 further includes a plurality of bonding pads 16 disposed between the plurality of pillars 12 and the seed layer 15. In some embodiments, a material of the plurality of bonding pads 16 includes solder paste or bonding adhesive. In some embodiments, the plurality of bonding pads 16 are formed through a printing process, such as a stencil printing process.

In some embodiments, the semiconductor device 1 further includes a protection layer (not shown in FIG. 1) disposed on the plurality of pillars 12 and the semiconductor package 11. In some embodiments, a material of the protection layer includes diamond like carbon (DLC) or other materials that are good conductors of heat and do not interact with water. In some embodiments, the protection layer is formed through a thin film deposition process, such as a physical vapor deposition (PVD) process, a chemical vapor deposition (CVD) process, a spraying process, a coating process, or the like. The semiconductor device of any of the following embodiments can be improved as described above, and will not be described again below.

The lid 13 is disposed on the substrate 10. In some embodiments, the semiconductor device 1 further includes a bonding layer 17 bonding the lid 13 on the substrate 10. In some embodiments, the bonding layer 17 is formed on bottom surface S13B of edges 13ED of the lid 13, and then the lid 13 on which the bonding layer 17 is formed is attached to the substrate 10. In some alternative embodiments, the bonding layer 17 is formed on the substrate 10, and then the lid 13 is attached to the bonding layer 17 on the substrate 10. The bonding layer 17 may be made of a heat resistant and waterproof material, and the bonding layer 17 may provide buffer or compensation for assembly of the lid 13. In some embodiments, a material of the bonding layer 17 includes thermocurable adhesives, photocurable adhesives, thermally conductive adhesive, thermosetting resin, waterproof adhesive, lamination adhesive or a combination thereof. In some embodiments, the material of the bonding layer 17 includes a thermally conductive adhesive. In some embodiments, the bonding layer 17 includes a metallic layer (not shown) with solder paste (not shown) deposited thereon. In some alternative embodiments, the lid 13 is fixed on the substrate 10 through a fixing mechanism (e.g., screws), and the bonding layer 17 may be omitted.

The lid 13 covers the semiconductor package 11 and the plurality of pillars 12. In some embodiments, the lid 13 extends substantially parallel to the substrate 10 and covers the semiconductor package 11 and the plurality of pillars 12, and edges 13ED of the lid 13 protrude toward the substrate 10 and be fixed on the substrate 10 by the bonding layer 17. In some embodiments, the edges 13ED of the lid 13 extend in a direction (e.g., an opposite direction of the stacking direction Z) perpendicular to the substrate 10. A method of forming the lid 13 may be selected according to the material(s) chosen for the lid 13. In some embodiments, a material of the lid 13 includes a thermally conductive material. In some embodiments, the material of the lid 13 includes metals or metal alloys, such as copper, aluminum, their alloys, the combinations thereof or the like. In some embodiments, the material of the lid 13 includes a semiconductor material such as silicon. In some embodiments, the material of the lid 13 includes polyimide, epoxy resin, acrylic resin (e.g., polymethylmethacrylate, PMMA), phenol resin, benzocyclobutene (BCB), polybenzooxazole (PBO), or any other suitable polymer-based material. In some embodiments, the lid 13 is molded, forged, 3D-printed, grown, or fabricated according to any other suitable technique. In some embodiments, multiple portions of the lid 13 are fabricated separately and then assembled. In some alternative embodiments, multiple portions of the lid 13 are integrally formed.

The lid 13 includes at least one inflow channel (e.g., two inflow channels 130) and at least one outflow channel (e.g., an outflow channel 132) to allow a coolant C to flow into and out of a space S between the substrate 10, the semiconductor package 11, the plurality of pillars 12 and the lid 13. The coolant C flows into the space S through the inflow channels 130 and carries away the heat transmitted to the plurality of pillars 12 through heat conduction. The coolant C flowing between the plurality of pillars 12 takes away the heat of the plurality of pillars 12 and causes its temperature to rise. The coolant C with increased temperature flows upward due to thermal convection and is discharged from the space S through the outflow channel 132. In some embodiments, the number of the at least one inflow channel is more than one. In some embodiments, the number of the at least one outflow channel is more than one. In some embodiments, at least one of the outflow channels is located adjacent to the center of the lid 13 to prevent heat from accumulating at the center of the semiconductor device 1. However, the arrangement of the inflow channel(s) and the outflow channel(s) may be changed according to needs. In some embodiments, the outflow channel(s) may be at least as large as the inflow channel(s). In some embodiments, the outflow channel(s) may be larger (has a wider opening) than the inflow channel(s). In some embodiments, the coolant C is a liquid. In some embodiments, the coolant C is water. In some embodiments, additives are added to the water to produce a cooling fluid. Examples of additives include surfactants, corrosion inhibitors, biocides, antifreeze, and the like.

In some embodiments, the inflow channels 130 and the outflow channel 132 may be located over the semiconductor package 11 and overlapped with the semiconductor package 11 along the stacking direction Z. In some embodiments, at least one of the plurality of pillars 12 is overlapped with the outflow channel 132 or the inflow channels 130 along the stacking direction Z.

Depths of the inflow channels 130 and the outflow channel 132 may be equal to a distance between an outer surface S13O of the lid 13 and an inner surface S13I of the lid 13 along the stacking direction Z. The inner surface S13I is located between the outer surface S13O and the substrate 10. The lid 13 has a first region R1 overlapped with the plurality of pillars 12 along the stacking direction Z and a second region R2 surrounding the first region R1. The inner surface S13I in the first region R1 (hereinafter as "inner surface S13I1") is an inner surface that faces and overlaps the plurality of pillars 12 along the stacking direction Z. The inner surface S13I in the second region R2 (hereinafter as "inner surface S13I2") is an inner surface that faces the plurality of pillars 12 without overlaps the plurality of pillars 12 along the stacking direction Z.

The inner surface S13I1 of the lid 13, which faces and overlaps the plurality of pillars 12 along the stacking direction Z, is a flat surface. In other words, the inner surface S13I1 is a surface without protrusions, indentations or other structures. In some embodiments, the flat surface (the inner surface S13I1) extends from the inflow channel 130 to the outflow channel 132. In some embodiments, the flat surface (the inner surface S13I1) is spaced apart from the plurality of pillars 12 so that a thickness of the coolant passage between the lid 13 and the semiconductor package 11 is larger than a sum of thicknesses of each pillar 12 and a corresponding bonding pad 15. In some alternative embodiments, the thickness of the coolant passage between the lid 13 and the semiconductor package 11 is equal to a sum of the thicknesses of each pillar 12 and a corresponding bonding pad 15 so that a first portion of the plurality of pillars 12 (e.g., the pillars 12 overlapped with the inner surface S13I1 along the stacking direction Z) is in contact with the flat surface (the inner surface S13I1) and a second portion of the plurality of pillars 12 (e.g., the pillars 12 overlapped with the inflow channels 130 or the outflow channel 132 along the stacking direction Z) is spaced apart from the flat surface (the inner surface S13I1). In some embodiments, the inner surface S13I1 and the inner surface S13I2 are flat surfaces. In some embodiments, the inner surface S13I1 and the inner surface S13I2 may have the same height. In other words, a distance D1 between the semiconductor package 11 and the inner surface S13I in the first region R1 (the inner surface S13I1) along the stacking direction Z is equal to a distance D2 between the semiconductor package 11 and the inner surface S13I in the second region R2 (the inner surface S13I2) along the stacking direction Z.

By disposing the plurality of pillars 12 closer to the heat sources (e.g., disposing the plurality of pillars 12 on the semiconductor package 11) instead of forming the plurality of pillars 12 on the inner surface S13I1 of the lid 13, the heat dissipation of the semiconductor device 1 may be improved, the structure design and manufacturing process of the lid 13 can be simplified, and the difficulty of assembly may be reduced. When the flat surface (the inner surface S13I1) is design to be spaced apart from the plurality of pillars 12, the integrity of the plurality of pillars 12 can be maintained during assembly (avoiding deformation of the plurality of pillars 12 by external forces), the flexibility of assembly can be improved, and the influence of the alignment offset on the heat dissipation effect can be reduced.

In some embodiments, the semiconductor device 1 further includes pipes 18 connected to the inflow channels 130 and the outflow channel 132 of the lid 13 and washers 19 that secure the attachment of the pipes 18 to the lid 13. In other embodiments, the lid 13 may be fabricated with washer(s) 19 fitted into the inflow channels 130 and the outflow channel 132 for subsequent connection with the pipes 18.

In some embodiments, the semiconductor device 1 further includes a sealant 20 disposed outside the lid 13 and at corners between the lid 13 and the substrate 10. The sealant 20 may be made of a heat resistant and waterproof material. A method of forming the sealant 20 and a material of the sealant 20 may be similar to those previously discussed with reference to the underfill 116, and will not be repeated here. In some embodiments, the sealant 20 is omitted.

In some embodiments, the semiconductor device 1 further includes a printed circuit board (PCB) 21 and connectors 22, and the substrate 10 may be bonded to the printed circuit board 21 via the connectors 22. A method of forming the connectors 22 and a material of the connectors 22 may be similar to those previously discussed with reference to the connectors 114, and will not be repeated here.

Figure 2:
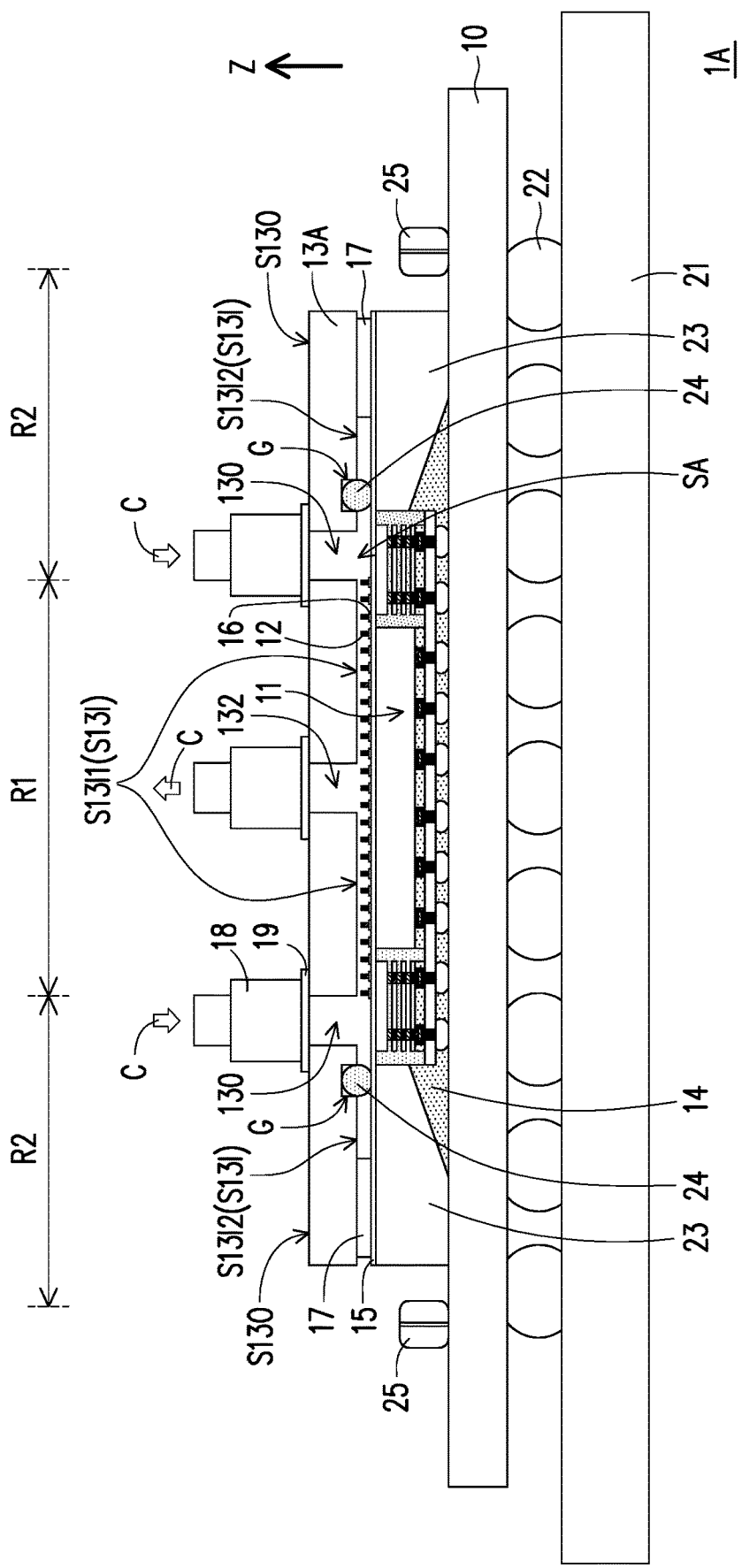

Referring to FIG. 2, a semiconductor device 1A may include a lid 13A, an encapsulant 23, an O shaped seal ring 24 (also referred to as O-ring) and a plurality of passive components 25 in addition to the substrate 10, the semiconductor package 11, the plurality of pillars 12, the underfill 14, the seed layer 15, the plurality of bonding pads 16, the bonding layer 17, the pipes 18, the washers 19, the printed circuit board 21 and the connectors 22 described above.

The lid 13A is, for example, a plate-like cover that extends in a direction parallel to the substrate 10. A material of the lid 13A may be similar to those previously discussed with reference to the lid 13 in FIG. 1, and will not be repeated here.

The encapsulant 23 is disposed on the underfill 14 and the substrate 10. A method of forming the encapsulant 23 and a material of the encapsulant 23 may be similar to those previously discussed with reference to the encapsulant 117 in FIG. 1, and will not be repeated here. In some embodiments, the top surface of the encapsulant 23 is flush with the top surface of the semiconductor package 11. In some embodiments, the seed layer 15 is disposed on the top surfaces of the semiconductor package 11 and the encapsulant 23. In some embodiments, the lid 13A is bonded to the seed layer 15 through the bonding layer 17 so that the bonding layer 17 is located between the seed layer 15 and the lid 13A. In some alternative embodiments, the seed layer 15 is disposed on the top surface of the semiconductor package 11 and exposes the top surface of the encapsulant 23, and the lid 13A is bonded to the encapsulant 23 through the bonding layer 17 so that the bonding layer 17 is located between the encapsulant 23 and the lid 13A.

The O shaped seal ring 24 is disposed on the encapsulant 23 and located between the bonding layer 17 and the plurality of pillars 12. When the seed layer 15 is disposed on the top surfaces of the semiconductor package 11 and the encapsulant 23, the O shaped seal ring 24 is disposed on the seed layer 15 and sandwiched by the inner surface S13I2 of the lid 13A and the seed layer 15. In some embodiments, the inner surface S13I2 of the lid 13A has a ring shaped groove G to secure the O shaped seal ring 24.

The O shaped seal ring 24 provides closure and segregation for avoiding fluid leakage from a space (e.g. a space SA between the lid 13A, the O shaped seal ring 24, the encapsulant 23, the plurality of pillars 12 and the semiconductor package 11) for the coolant C to flow therein. In some embodiments, the O shaped seal ring 24 is a seal ring (e.g., o-ring) made of a polymeric material, such as an organic resin or rubber. In some embodiments, the O shaped seal ring 24 may include a silicone filling.

The plurality of passive components 25 are disposed on the substrate 10. In some embodiments, the plurality of passive components 25 are resistors, capacitors, inductors, or the like.

Figure 3:
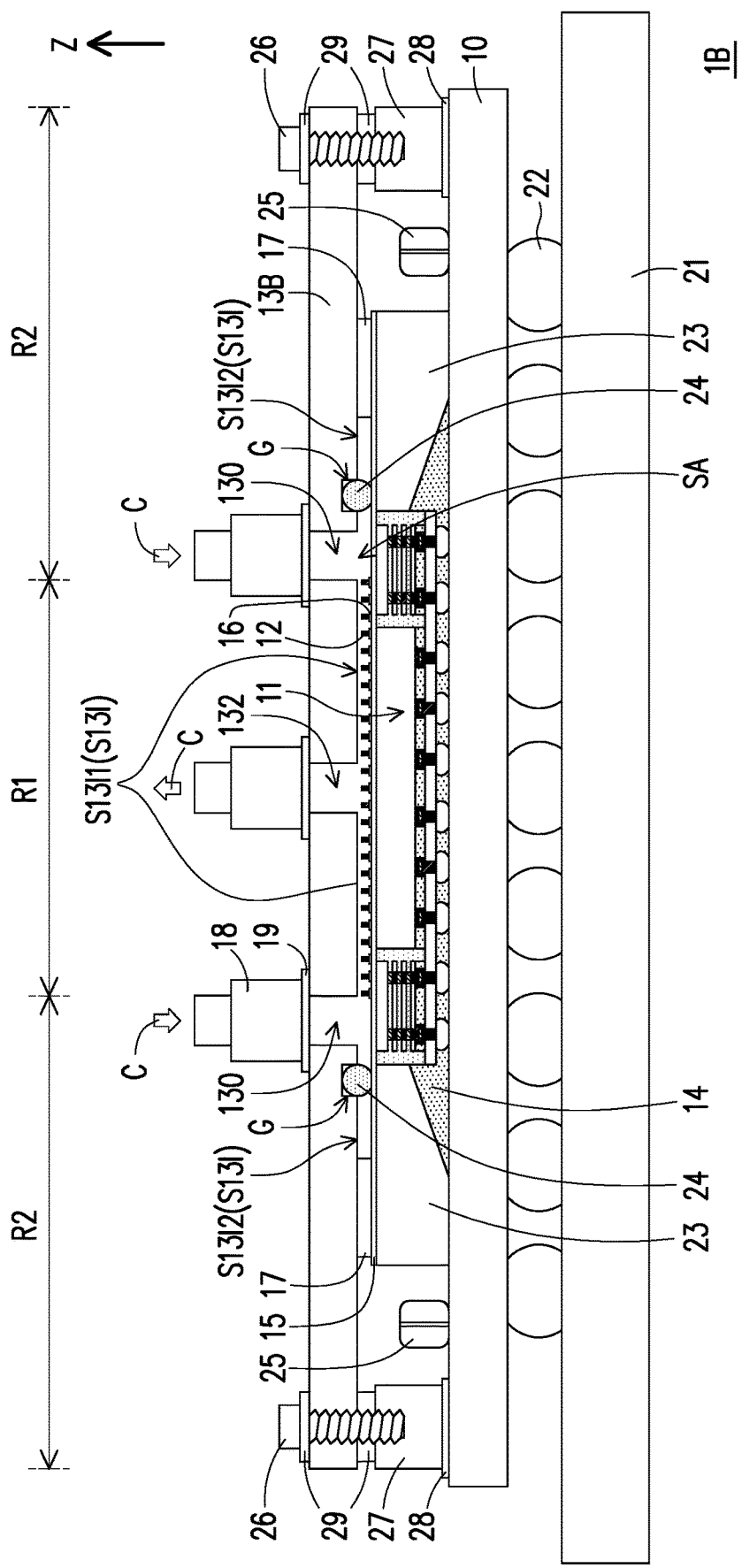

Referring to FIG. 3, a semiconductor device 1B may include a lid 13B, a plurality of screws 26, a ring shaped structure 27, a bonding layer 28 and washers 29 in addition to the substrate 10, the semiconductor package 11, the plurality of pillars 12, the underfill 14, the seed layer 15, the plurality of bonding pads 16, the bonding layer 17, the pipes 18, the washers 19, the printed circuit board 21, the connectors 22, the encapsulant 23, two O shaped seal rings 24 and the plurality of passive components 25 described above.

The lid 13B is similar to those previously discussed with reference to the lid 13A in FIG. 2. However, the lid 13B is further disposed over the plurality of passive components 25 in addition to the semiconductor package 11 and the encapsulant 23. Moreover, the lid 13B is screwed on the substrate 10 through the plurality of screws 26. In some embodiments, the plurality of passive components 25 are located between the encapsulant 23 and the plurality of screws 26. In some embodiments, the plurality of screws 26 may be screwed to the ring shaped structure 27 attached on the substrate 10. In some embodiments, the ring shaped structure 27 is attached on the substrate 10 through the bonding layer 28. The ring shaped structure 27 has a threaded structure corresponding to the plurality of screws 26. A material of the bonding layer 28 may be similar to those previously discussed with reference to the bonding layer 17, and will not be repeated here. In some embodiments, the plurality of screws 26 are secured by the washers 29. In some embodiments, the screws 26 may be screwed to the substrate 10 via the ring shaped structure 27, which means that the substrate 10 may have a threaded structure for screw fixing.

Figure 4:
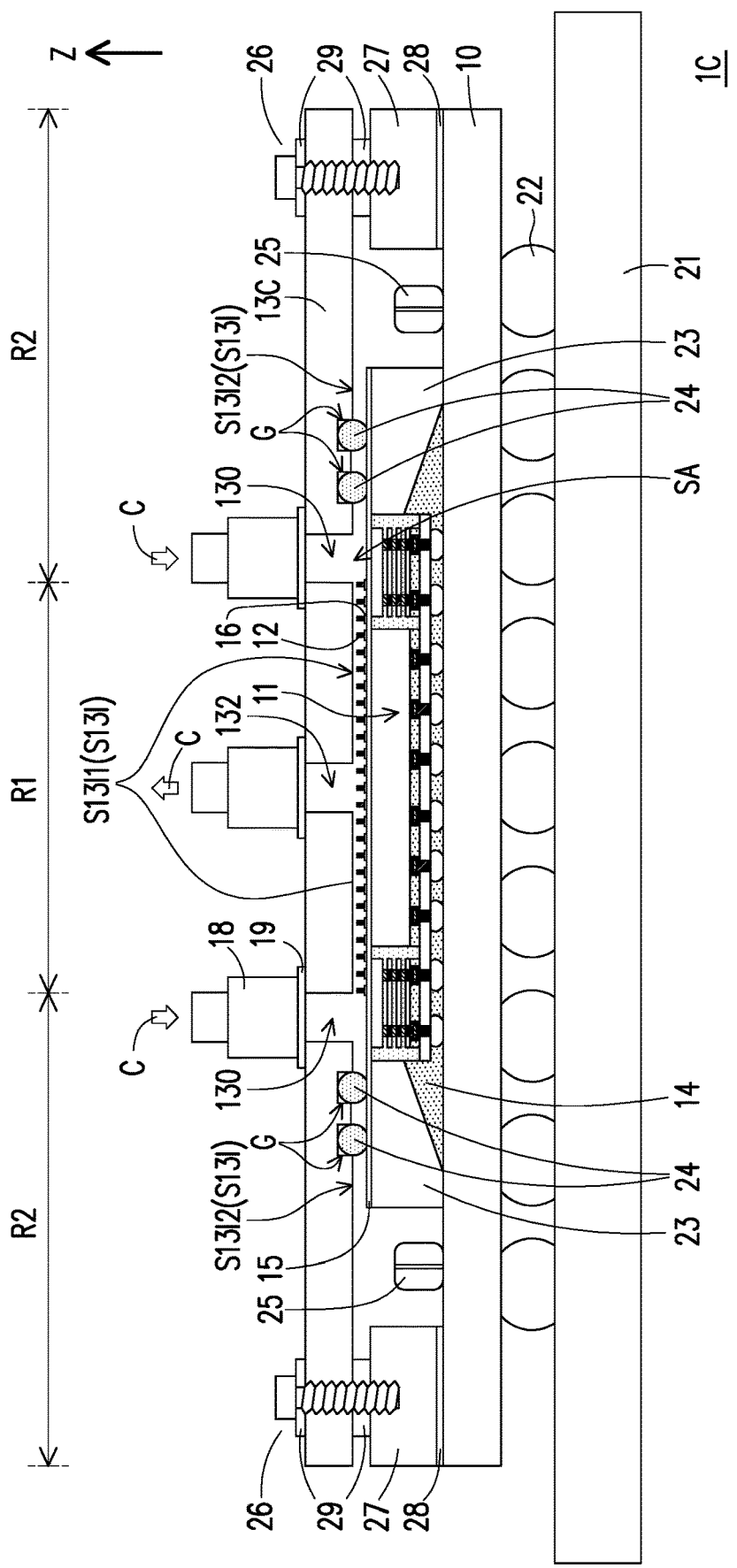

Referring to FIG. 4, a semiconductor device 1C may include a lid 13C in addition to the substrate 10, the semiconductor package 11, the plurality of pillars 12, the underfill 14, the seed layer 15, the plurality of bonding pads 16, the pipes 18, the washers 19, the printed circuit board 21, the connectors 22, the encapsulant 23, two O shaped seal rings 24, the plurality of passive components 25, the plurality of screws 26, the ring shaped structure 27, the bonding layer 28 and the washers 29 described above.

The lid 13C is similar to those previously discussed with reference to the lid 13B in FIG. 3. However, the inner surface S13I2 of the lid 13C includes two ring shaped grooves G (e.g., an inner ring shaped groove and an outer ring shaped groove surrounding the inner ring shaped groove) to secure the two O shaped seal rings 24 located between the plurality of pillars 12 and the plurality of passive components 25.

Figure 5:
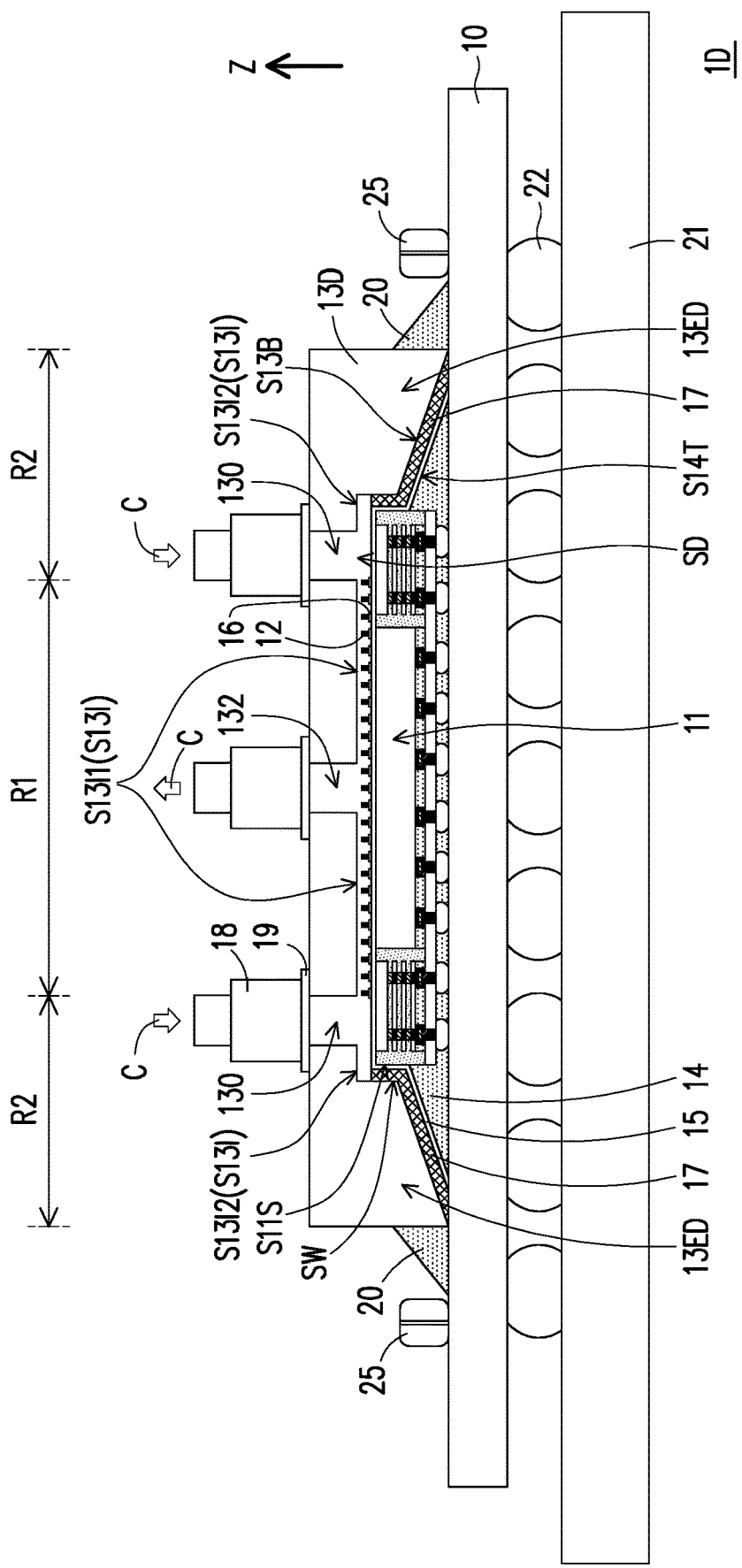

Referring to FIG. 5, a semiconductor device 1D may include a lid 13D in addition to the substrate 10, the semiconductor package 11, the plurality of pillars 12, the underfill 14, the seed layer 15, the plurality of bonding pads 16, the bonding layer 17, the pipes 18, the washers 19, the sealant 20, the printed circuit board 21, the connectors 22 and the plurality of passive components 25 described above.

The lid 13D is similar to those previously discussed with reference to the lid 13 in FIG. 1. However, as shown in FIG. 5, the edges 13ED of the lid 13D are overlapped with the underfill 14 along the stacking direction Z. Moreover, a space SD for the coolant C to flow therein is between the semiconductor package 11, the plurality of pillars 12, the lid 13D and the bonding layer 17.

When the seed layer 15 is disposed on the underfill 14, the edges 13ED of the lid 13D are fixed to the seed layer 15 through the bonding layer 17. When the seed layer 15 exposes the underfill 14, the edges 13ED of the lid 13D are fixed to the underfill 14 through the bonding layer 17. In both cases, the underfill 14 is located between the bonding layer 17 and the substrate 10, and the bonding layer 17 is located between the lid 13D and the underfill 14 and between the lid 13D and the semiconductor package 11. To be more specific, the bonding layer 17 is located between the underfill 14 and the lid 13D and between a side surface S11S of the semiconductor package 11 and an inner wall SW of the lid 13D. In some embodiments, the bottom surface S13B of the edges 13ED of the lid 13D has a slope the same as or approximate to that of the top surface S14T of the underfill 14. In some alternative embodiments, the bottom surface S13B of the edges 13ED of the lid 13D has a slope different from that of the top surface S14T of the underfill 14.

By bonding the lid 13D to the underfill 14, more components (such as passive components 25) are able to be placed on the substrate.

Figure 6:
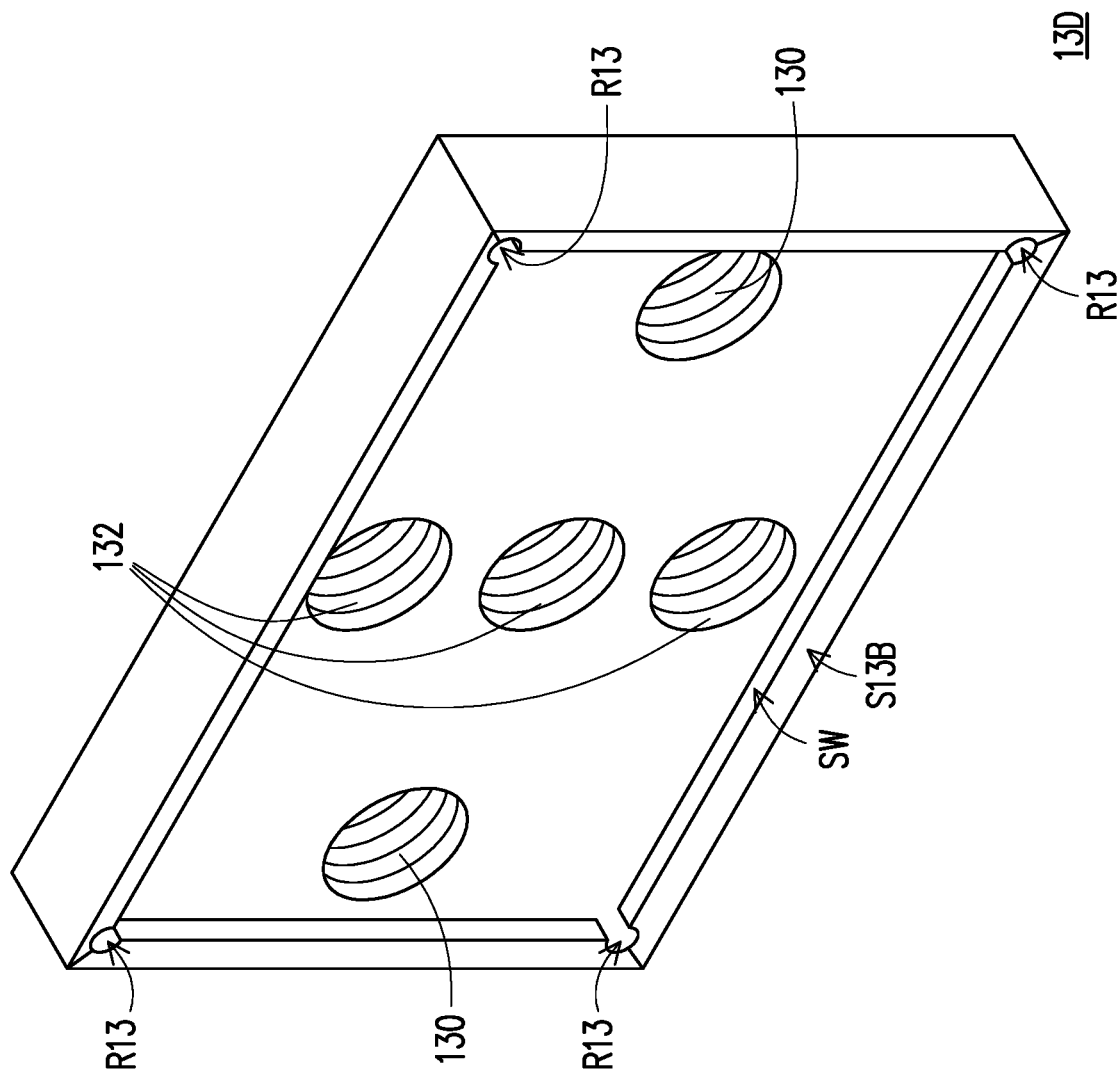
FIG. 6 is a stereo view schematically illustrating a lid in FIG. 5.

FIG. 6 is a stereo view schematically illustrating the lid 13D in FIG. 5. Referring to FIGS. 5 and 6, the lid 13D may have a plurality of cylindrical regions R13 (not shown in FIG. 5) located at corners of the lid 13D and in contact with the bonding layer 17 when the lid 13D is bonded to the underfill 14 and the semiconductor package 11. The formation of the plurality of cylindrical regions R13 enables the lid 13D to be assembled (or matched) with corners (usually having right angles) of the semiconductor package 11. In some embodiments, the cylindrical regions R13 are milling chamfers formed through a milling machining process by a machining tool, but not limited thereto.

FIG. 7 through FIG. 10 are cross-sectional views schematically illustrating other semiconductor devices according to some embodiments of the present disclosure.

Figure 7:
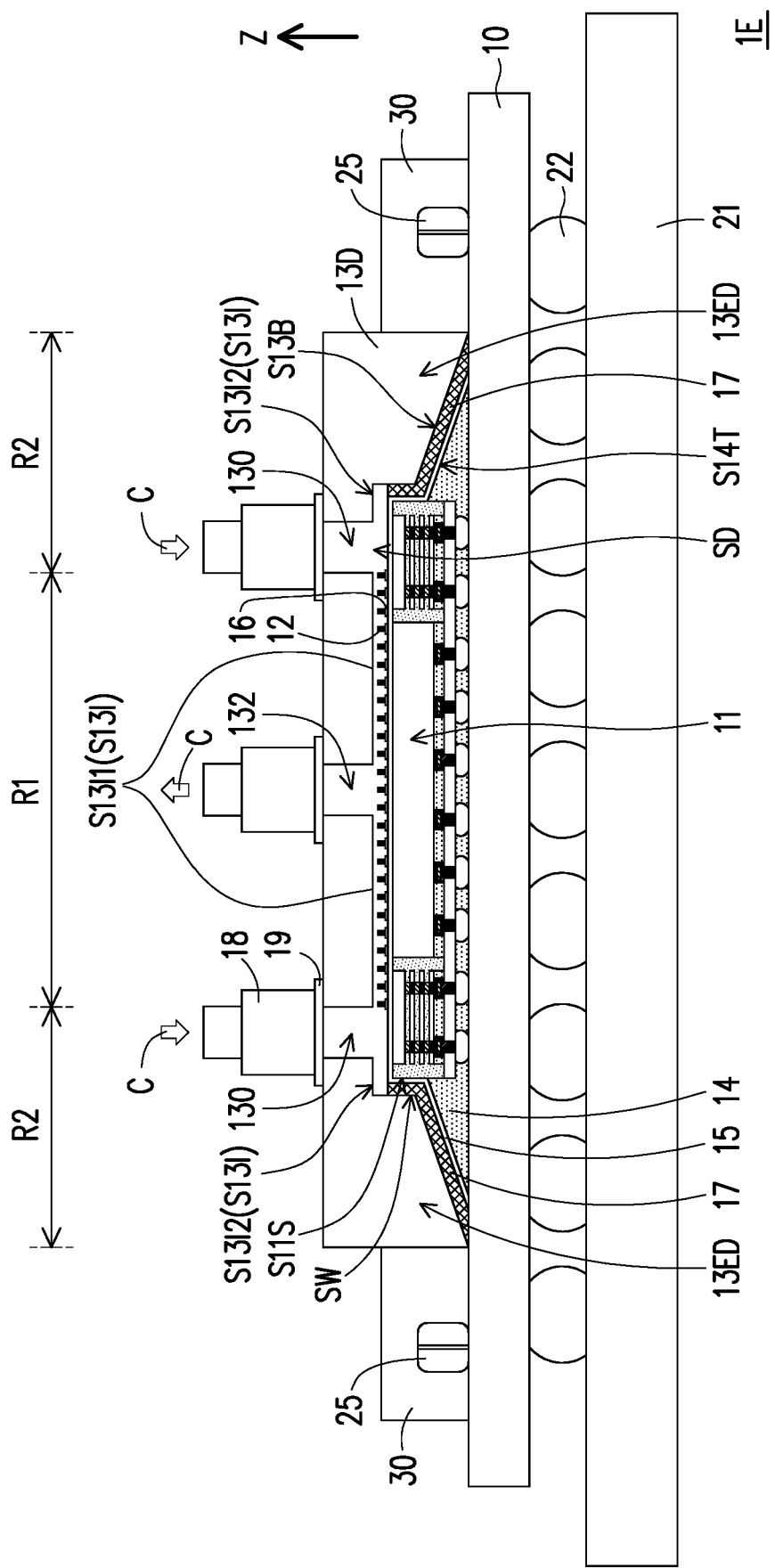
FIG. 7 through FIG. 10 are cross-sectional views schematically illustrating other semiconductor devices according to some embodiments of the present disclosure.

Referring to FIG. 7, a semiconductor device 1E may include an encapsulant 30 in addition to the substrate 10, the semiconductor package 11, the plurality of pillars 12, the lid 13D, the underfill 14, the seed layer 15, the plurality of bonding pads 16, the bonding layer 17, the pipes 18, the washers 19, the printed circuit board 21, the connectors 22 and the plurality of passive components 25 described above.

The encapsulant 30 is disposed on the substrate 10 and covers the plurality of passive components 25. A material of the encapsulant 30 may be similar to those previously discussed with reference to the encapsulant 117 in FIG. 1, and will not be repeated here.

Figure 8:
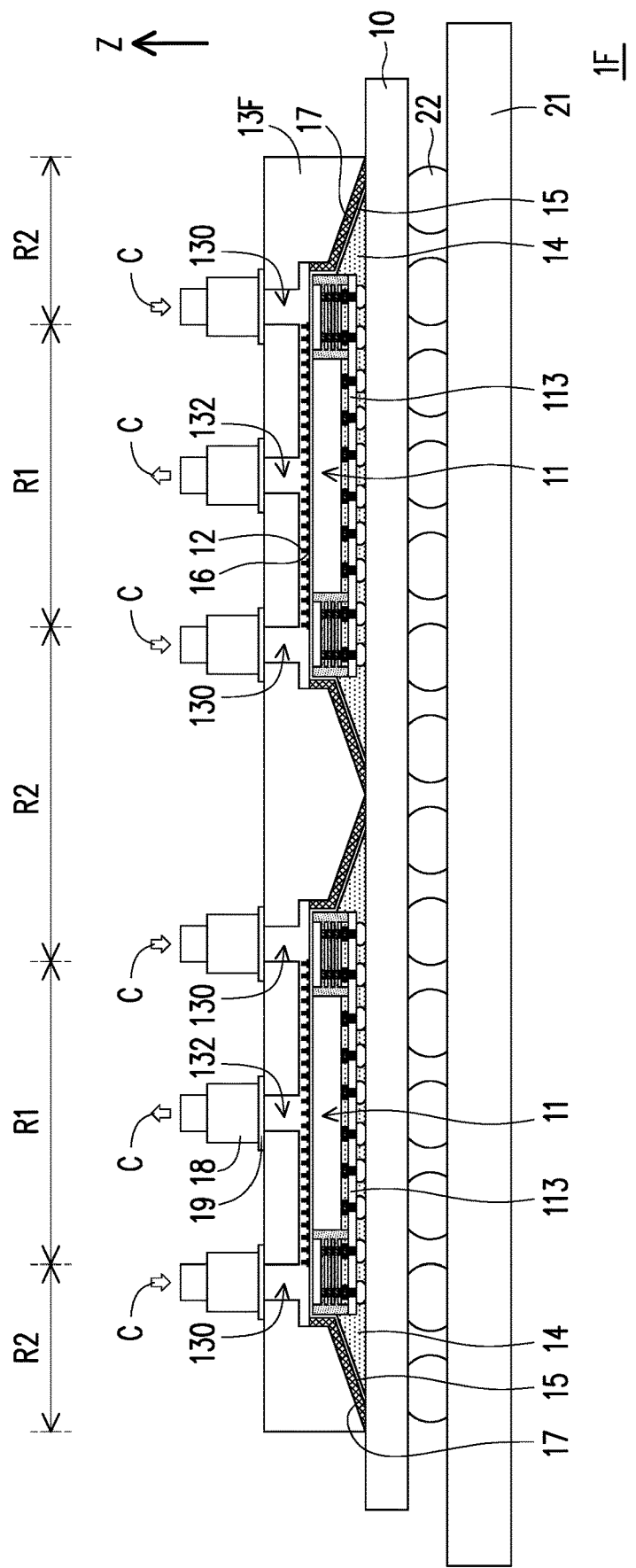

Referring to FIG. 8, a semiconductor device IF may include a lid 13F in addition to the substrate 10, a plurality of the semiconductor packages 11, the plurality of pillars 12, the underfill 14, the seed layer 15, the plurality of bonding pads 16, the bonding layer 17, the pipes 18, the washers 19, the printed circuit board 21 and the connectors 22 described above.

The lid 13F is disposed on the plurality of semiconductor packages 11. A material of the lid 13F may be similar to those previously discussed with reference to the lid 13 in FIG. 1, and will not be repeated here. In other embodiments, the semiconductor device IF may further include the passive components 25 and the encapsulant 30 shown in FIG. 7.

Figure 9:
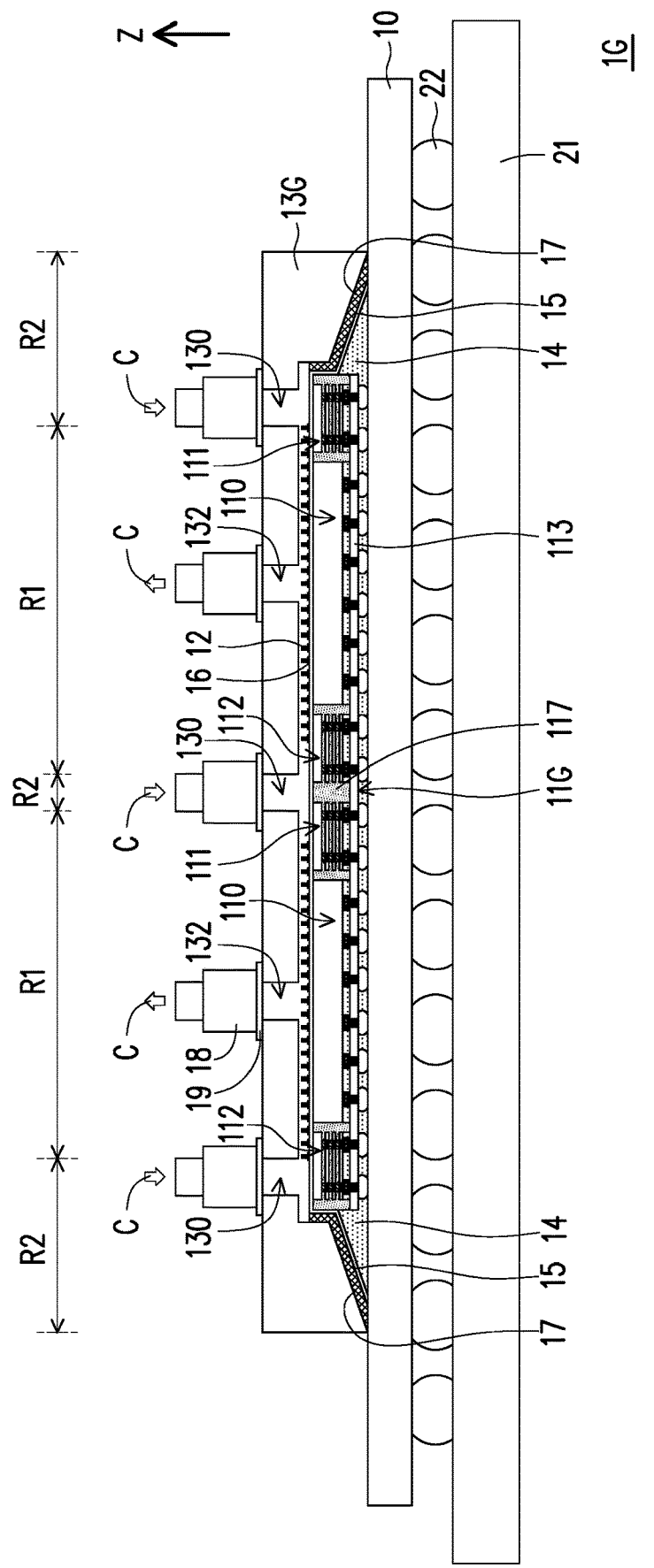

Referring to FIG. 9, a semiconductor device 1G may include a semiconductor package 11G and a lid 13G in addition to the substrate 10, the plurality of pillars 12, the underfill 14, the seed layer 15, the plurality of bonding pads 16, the bonding layer 17, the pipes 18, the washers 19, the printed circuit board 21 and the connectors 22 described above.

The semiconductor package 11G is similar to the semiconductor package 11 in FIG. 1. However, the semiconductor package 11G includes a plurality of the semiconductor dies 110, a plurality of the semiconductor dies 111 and a plurality of the semiconductor dies 112. In some embodiments, as shown in FIG. 9, one semiconductor die 111 and one semiconductor die 112 are located on opposite sides of each semiconductor die 110, and one semiconductor die 111 and one semiconductor die 112 are located between two semiconductor dies 110. Moreover, the plurality of semiconductor dies 110, the plurality of semiconductor dies 111 and the plurality of semiconductor dies 112 may be disposed on one interposer (e.g., the interposer 113). In some embodiments, the semiconductor die 111 and the semiconductor die 112 that are located between the two semiconductor dies 110 are disposed adjacent to each other to achieve miniaturization by shortening the distance between the semiconductor die 111 and the semiconductor die 112 that are located between the two semiconductor dies 110. In some embodiments, the space between the semiconductor die 111 and the semiconductor die 112 that are located between the two semiconductor dies 110 is filled by the encapsulant 117, so that the semiconductor package 11G provides a flat surface on which the seed layer 15 is disposed.

The lid 13G is disposed on the substrate 10 and located over the semiconductor package 11G. A material and configuration of the lid 13G may be similar to those previously discussed with reference to the lid 13D in FIG. 7, and will not be repeated here. In other embodiments, the semiconductor device 1G may further include the passive components 25 and the encapsulant 30 shown in FIG. 7.

Figure 10:
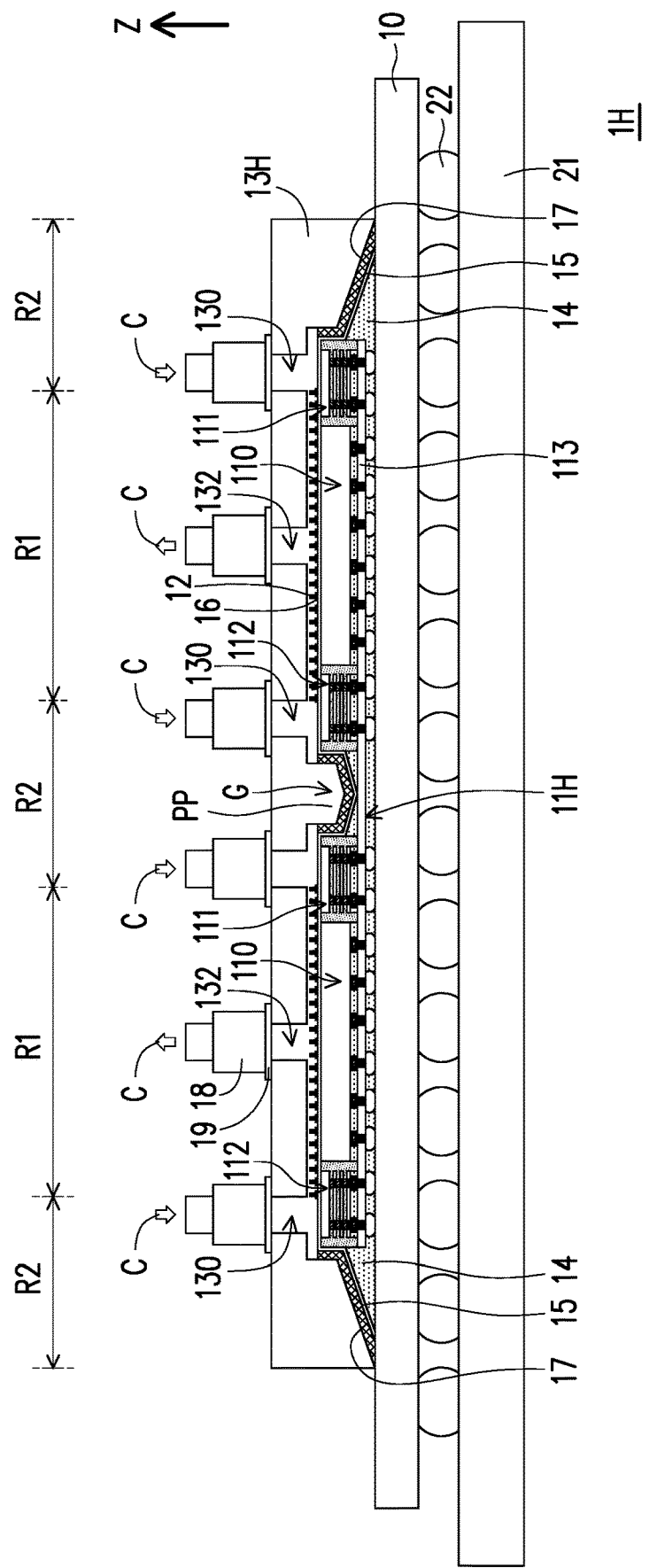

Referring to FIG. 10, a semiconductor device 1H may include a semiconductor package 11H and a lid 13H in addition to the substrate 10, the plurality of pillars 12, the underfill 14, the seed layer 15, the plurality of bonding pads 16, the bonding layer 17, the pipes 18, the washers 19, the printed circuit board 21 and the connectors 22 described above.

The semiconductor package 11H is similar to the semiconductor package 11G in FIG. 9. However, a distance between the semiconductor die 111 and the semiconductor die 112 that are located between the two semiconductor dies 110 is larger than those described in FIG. 9. Accordingly, a groove G is located between two adjacent semiconductor dies (e.g. the semiconductor die 111 and the semiconductor die 112 that are located between the two semiconductor dies 11) among the plurality of the semiconductor dies 110, 111 and 112. Correspondingly, the lid 13H has a protrusion portion PP extending into the groove G located between the two adjacent semiconductor dies (e.g. the semiconductor die 111 and the semiconductor die 112 that are located between the two semiconductor dies 11) among the plurality of the semiconductor dies 110, 111 and 112. A material of the lid 13H may be similar to those previously discussed with reference to the lid 13D in FIG. 7, and will not be repeated here. In other embodiments, the semiconductor device 1H may further include the passive components 25 and the encapsulant 30 shown in FIG. 7.

Figure 11:
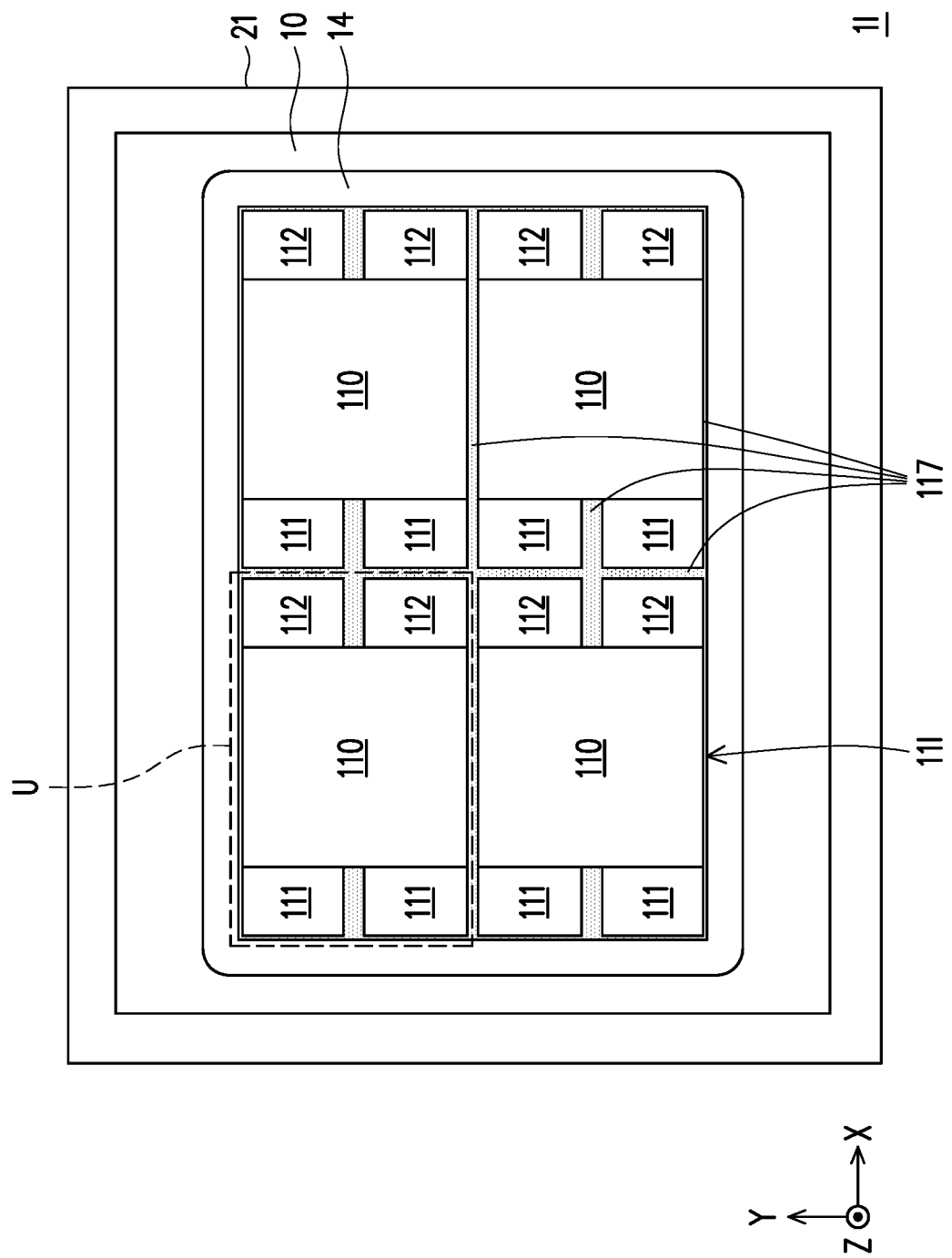
FIG. 11 is a top view schematically illustrating a semiconductor device according to some embodiments of the present disclosure.

FIG. 11 is a top view schematically illustrating a semiconductor device according to some embodiments of the present disclosure. In FIG. 11, elements disposed on the semiconductor package 11I are not shown to clearly show the relative positions between the semiconductor package 11I and elements disposed below the semiconductor package 11I.

Referring to FIG. 11, a semiconductor device 1I may be similar to the semiconductor device 1G in FIG. 9 or the semiconductor device 1H in FIG. 10. As shown in FIG. 11, the semiconductor device 1I may include four package units U arranged in an array. Each package unit U include one semiconductor die 110, two semiconductor dies 111 and two semiconductor dies 112. In some embodiments, the two semiconductor dies 111 are disposed on a side of the semiconductor die 110 and arranged along a direction Y, and the two semiconductor dies 112 are disposed on another side, which is opposite to the two semiconductor dies 111, of the semiconductor die 110 along the direction Y. However, the number and arrangement of the package units U in the semiconductor device 1I may be changed according to requirement. In other embodiments, the semiconductor device (not shown) may include two package units U arranged along the direction Y or a direction X perpendicular to the direction Y. In some alternative embodiments, the semiconductor device (not shown) may include more than four package units U. In some embodiments, the package units U may share the same interposer 113 (shown in FIG. 1). In some alternative embodiments, each package unit U includes one interposer 113 (shown in FIG. 1).

In an embodiment, a semiconductor device includes a substrate, a semiconductor package, a plurality of pillars and a lid. The semiconductor package is disposed on the substrate and includes at least one semiconductor die. The plurality of pillars are disposed on the semiconductor package. The lid is disposed on the substrate and covers the semiconductor package and the plurality of pillars. The lid includes an inflow channel and an outflow channel to allow a coolant to flow into and out of a space between the substrate, the semiconductor package, the plurality of pillars and the lid. An inner surface of the lid, which faces and overlaps the plurality of pillars along a stacking direction of the semiconductor package and the lid, is a flat surface.

In an embodiment, a semiconductor device includes a substrate, a semiconductor package, a plurality of pillars and a lid. The semiconductor package is disposed on the substrate and includes at least one semiconductor die. The plurality of pillars are disposed on the semiconductor package. The lid is disposed on the substrate and covers the semiconductor package and the plurality of pillars. The lid includes an inflow channel and an outflow channel overlapped with the semiconductor package along a stacking direction of the semiconductor package and the lid. The plurality of pillars are at least overlapped with the lid and the outflow channel along the stacking direction, and the plurality of pillars are spaced apart from the lid.

In an embodiment, a semiconductor device includes a substrate, a semiconductor package, an underfill, a plurality of pillars, a lid and a bonding layer. The semiconductor package is disposed on the substrate and includes at least one semiconductor die. The underfill is disposed between the semiconductor package and the substrate. The plurality of pillars are disposed on the semiconductor package. The lid is disposed on the substrate and covers the underfill, the semiconductor package and the plurality of pillars. The lid includes an inflow channel and an outflow channel overlapped with the semiconductor package along a stacking direction of the semiconductor package and the lid. The bonding layer is located between the underfill and the lid and between a side surface of the semiconductor package and an inner wall of the lid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor package disposed on the substrate;
   a plurality of pillars disposed on the semiconductor package;
   a lid disposed on the substrate and covering the semiconductor package and the plurality of pillars, the lid comprising an inflow channel and an outflow channel to allow a coolant to flow into and out of a space between the substrate, the semiconductor package, the plurality of pillars and the lid; and
   a seed layer disposed between the plurality of pillars and the semiconductor package, wherein the semiconductor package is isolated from the coolant through the seed layer.

2. The semiconductor device as claimed in claim 1, wherein the lid is spaced apart from the plurality of pillars.

3. The semiconductor device as claimed in claim 1, wherein a first portion of the plurality of pillars is in contact with the lid, and a second portion of the plurality of pillars is spaced apart from the lid.

4. The semiconductor device as claimed in claim 1, wherein the outflow channel and the inflow channel are overlapped with the semiconductor package.

5. The semiconductor device as claimed in claim 1, wherein at least one of the plurality of pillars is overlapped with the outflow channel or the inflow channel.

6. The semiconductor device as claimed in claim 1, further comprising:
   an underfill disposed between the semiconductor package and the substrate; and
   a bonding layer bonding the lid on the substrate.

7. The semiconductor device as claimed in claim 6, wherein the bonding layer surrounds the semiconductor package and the underfill.

8. The semiconductor device as claimed in claim 6, wherein the underfill is located between the bonding layer and the substrate, the bonding layer is located between the lid and the underfill and between the lid and the semiconductor package.

9. The semiconductor device as claimed in claim 8, wherein the lid has a plurality of cylindrical regions located at corners of the lid and in contact with the bonding layer.

10. The semiconductor device as claimed in claim 6, further comprising:
    an encapsulant disposed on the underfill and the substrate; and
    a ring shaped sealant disposed on the encapsulant and located between the bonding layer and the plurality of pillars, wherein the space for the coolant to flow therein is between the lid, the ring shaped sealant, the encapsulant, the plurality of pillars and the semiconductor package.

11. The semiconductor device as claimed in claim 10, wherein the lid is further screwed on the substrate through a plurality of screws.

12. The semiconductor device as claimed in claim 11, further comprising:
    a plurality of passive components disposed on the substrate and located between the encapsulant and the plurality of screws.

13. The semiconductor device as claimed in claim 1, wherein the semiconductor package comprises a plurality of semiconductor dies and an interposer on which the semiconductor dies are disposed.

14. The semiconductor device as claimed in claim 13, wherein the lid has a protrusion portion extending into a groove located between two adjacent semiconductor dies among the plurality of the semiconductor dies.

15. A semiconductor device, comprising:
    a substrate;
    a semiconductor package disposed on the substrate;
    a lid disposed on the substrate and surrounding the semiconductor package so that a space is formed between the substrate, the semiconductor package, and the lid, wherein the lid comprises an inflow channel and an outflow channel to allow a coolant to flow into and out of the space;
    a plurality of pillars disposed in the space and between the semiconductor package and the lid, wherein the plurality of pillars are spaced apart from the lid; and
    a seed layer disposed between the plurality of pillars and the semiconductor package, wherein the semiconductor package is isolated from the coolant through the seed layer.

16. The semiconductor device as claimed in claim 15, wherein the lid comprises a flat portion overlapped with the semiconductor package and the plurality of pillars and a protruding portion connected to the flat portion and protruding from the flat portion toward the substrate.

17. The semiconductor device as claimed in claim 15, wherein the outflow channel and the inflow channel are overlapped with the semiconductor package.

18. A semiconductor device, comprising:
    a substrate;
    a semiconductor package disposed on the substrate;
    an underfill disposed between the semiconductor package and the substrate;
    an encapsulant disposed on the underfill and the substrate;
    a plurality of pillars disposed on the semiconductor package;
    a lid disposed on the substrate and covering the underfill, the semiconductor package, the encapsulant and the plurality of pillars; and
    a ring shaped sealant disposed between the encapsulant and the lid and surrounding the plurality of pillars so that a space is formed between the semiconductor package, the encapsulant, the plurality of pillars, the lid and the ring shaped sealant, wherein the lid comprises an inflow channel and an outflow channel to allow a coolant to flow into and out of the space.

19. The semiconductor device as claimed in claim 18, further comprising:
    a seed layer disposed between the plurality of pillars and the semiconductor package and between the ring shaped sealant and the encapsulant, wherein the semiconductor package is isolated from the coolant through the seed layer.

20. The semiconductor device as claimed in claim 18, wherein the outflow channel and the inflow channel are overlapped with the semiconductor package.

* * * * *